United States Patent [19]
Sawai

[11] Patent Number: 5,463,395
[45] Date of Patent: Oct. 31, 1995

[54] SEMI-FLASH TYPE A/D CONVERTER EMPLOYING A CORRECTION ENCODER FOR ELIMINATING ERRORS IN THE OUTPUT SIGNALS DUE TO NOISE, AND A CORRESPONDING METHOD THEREFOR

[75] Inventor: Yasunori Sawai, Tokyo, Japan

[73] Assignee: NEC Corporation, Tokyo, Japan

[21] Appl. No.: 127,373

[22] Filed: Sep. 28, 1993

[30] Foreign Application Priority Data

Sep. 28, 1992 [JP] Japan ..................... 4-282401

[51] Int. Cl.$^6$ .................................. H03M 1/14
[52] U.S. Cl. ............................. 341/156; 341/94
[58] Field of Search ............................ 341/94, 156, 158, 341/159, 160

[56] References Cited

U.S. PATENT DOCUMENTS

| | | | |
|---|---|---|---|
| 4,211,999 | 7/1980 | Clark et al. ............................. | 341/160 |
| 4,291,299 | 9/1981 | Hinz et al. .............................. | 341/160 |
| 4,887,084 | 12/1989 | Yamaguchi ............................ | 341/160 |
| 4,897,657 | 1/1990 | Brubaker ............................... | 341/159 |
| 5,029,305 | 7/1991 | Richardson ........................... | 341/159 |
| 5,315,301 | 5/1994 | Hosotani et al. ....................... | 341/94 |
| 5,327,135 | 7/1994 | Hosotani et al. ...................... | 341/156 |

FOREIGN PATENT DOCUMENTS 2190258  11/1987  United Kingdom .

OTHER PUBLICATIONS

Millman, *Microelectronics: Digital and Analog Circuits and Systems*, 1979 pp. 189–193, 612 and 613.

"Subranging ADCs operate at high speed with high resolution" by Ray K. Ushani, Datel Inc., vol. 36, No. 8, Nov. 4, 1991, pp. 139–152, Aug. 23, 1991.

"Current Technology and Future Perspective for High-Speed A/D Converters", pp. 21–28, by Akira Matsuzawa, Semiconductor Research Center, Matsushita Industrial Co., Ltd.

*Primary Examiner*—Howard L. Williams
*Attorney, Agent, or Firm*—Sughrue, Mion, Zinn, Macpeak & Seas

[57] ABSTRACT

A semi-flash type analog/digital converter for eliminating errors in its output signals which are caused by noise. The analog/digital converter includes a D/A converter for outputting a plurality of analog signals which are produced based on a plurality of input signals. A plurality of comparators compare the voltage of an analog input signal, provided via a sample and hold circuit, with the analog signals output from the D/A converter. The output from the comparators are supplied to two latches, which further provide the outputs to a plurality of encoders. One of the encoders encodes the signals provided by one of the latches and outputs signals representative of high order bits of a digital signal. A second encoder, which encodes output signals provided by the other latch, is a correction encoder. The correction encoder corrects the signals provided by the latch if it determines that any of the signals are in error, and outputs signals representing the lower order bits of a digital output signal. The correction encoder includes either a priority control circuit or an adder circuit which performs the correction.

6 Claims, 8 Drawing Sheets

SEMI-FLASH TYPE A/D CONVERTER EMPLOYING A CORRECTION ENCODER FOR ELIMINATING ERRORS IN THE OUTPUT SIGNALS DUE TO NOISE, AND A CORRESPONDING METHOD THEREFOR

BACKGROUND OF THE INVENTION

1. Field of the Invention

The present invention relates to a semi-flash type A/D (Analog to Digital) converter and semi-flash type A/D converting method, and, more particularly, a semi-flash type A/D converter and semi-flash type A/D converting method which is insusceptible to noise.

2. Description of the Related Art

A semi-flash type A/D converter has a plurality of comparators, and successively performs comparison by a plurality of bits using the comparators to convert an analog signal into a digital signal. As this A/D converter successively performs comparison by a plurality of bits, it can convert an analog signal into a digital signal faster than an ordinary successive comparison type A/D converter.

An example of the structure of a conventional semi-flash type A/D converter will be described referring to FIG. 1. FIG. 1 shows the structure of a semi-flash type 6-bit A/D converter which performs two consecutive comparing operations by three bits. The A/D converter shown in FIG. 1 comprises a D/A converter 101, a selector 102, seven comparators 103 to 109, a sample and hold circuit 110, latches 111 and 112, encoders 113 and 501, and registers 115 and 116 for storage of the conversion results. Signals S0, S1, S2, CLK and EOC are timing signals for controlling the converting operation, and are generated inside this semi-flash type A/D converter.

The D/A converter 101 comprises a plurality of resistors as shown in, for example, FIG. 2. The D/A converter 101 receives signals 200 to 207 from the encoder 113 and outputs signals 210 to 216 and signals 220 to 226. The signals 210 to 216 and signals 220 to 226 have potentials obtained by dividing a difference between a conversion reference potential VREF and a conversion reference ground potential AVSS by resistors. The potentials of the signals 210–216 have the following relationship.

signal 210 > signal 211 > signal 212 > signal 213 > signal 214 > signal 215 > signal 216

The signals 220–226 are obtained through switches A to H, respectively. The switches A to H are selected in association with the output signals 200–207 from the encoder 113. The potentials of the signals 220–226 have the following relationship.

signal 220 > signal 221 > signal 222 > signal 223 > signal 224 > signal 225 > signal 226

Table 1 shows the relation between the potentials of the output signals 200–207 of the encoder 113 and those of the signals 220–226, obtained by the actions of the switches A–H.

TABLE 1

| Signal | | | | | | | | Function of D/A converter 101 | | |
|---|---|---|---|---|---|---|---|---|---|---|
| | | | | | | | | Action of Switches | Potentials of Signals 220–226 | |
| 200 | 201 | 202 | 203 | 204 | 205 | 206 | 207 | A–H | Smaller than | Larger than |
| 1 | 0 | 0 | 0 | 0 | 0 | 0 | 0 | only A ON |  | VREF potential 210 |
| 0 | 1 | 0 | 0 | 0 | 0 | 0 | 0 | only B ON | potential 210 | potential 211 |
| 0 | 0 | 1 | 0 | 0 | 0 | 0 | 0 | only C ON | potential 211 | potential 212 |
| 0 | 0 | 0 | 1 | 0 | 0 | 0 | 0 | only D ON | potential 212 | potential 213 |
| 0 | 0 | 0 | 0 | 1 | 0 | 0 | 0 | only E ON | potential 213 | potential 214 |
| 0 | 0 | 0 | 0 | 0 | 1 | 0 | 0 | only F ON | potential 214 | potential 215 |
| 0 | 0 | 0 | 0 | 0 | 0 | 1 | 0 | only G ON | potential 215 | potential 216 |
| 0 | 0 | 0 | 0 | 0 | 0 | 0 | 1 | only H ON | potential 216 | AVSS |

L level = 0
H level = 1

The selector 102 (FIG. 1) selects the signals 210–216 supplied from the D/A converter 101 while the timing signal S2 is at an L (low) level. While the timing signal S2 is at an H (high) level, the selector 102 selects the signals 220–226 from the D/A converter 101 and supplies the selected signals to inverting input terminals of the comparators 103–109.

An analog signal, which is to be converted into a digital signal, is supplied to an analog input terminal AIN. The sample and hold circuit 110 samples the potential of the analog signal supplied to the analog input terminal AIN during the H-level duration of the timing signal S0, and holds the sampled potential and supplies that potential to the non-inverting input terminals of the comparators 103–109 during the L-level duration of the timing signal S0.

The comparators 103–109 each compare the potentials of the two input signals with each other. Each of the comparators 103–109 outputs an L-level signal when the potential of the signal supplied to the inverting input terminal is higher than that of the signal supplied to the non-inverting input terminal and outputs an H-level signal when the potential of the signal supplied to the inverting input terminal is lower than that of the signal supplied to the non-inverting input terminal.

The latch 111 latches the output signals of the comparators 103–109 while the timing signals S1 and CLK are both at an H level, and holds the latched signals during the other period. The latch 112 latches the output signals of the comparators 103–109 while the timing signals S2 and CLK are both at an H level, and holds the latched signals during the other period.

The encoder 113, which is a logic circuit having a structure as shown in, for example, FIG. 3, produces signals 250 to 252 as well as the signals 200 to 207 from output signals 230 to 236 of the latch 111.

The encoder 501, which is a logic circuit having a structure as shown in FIG. 4, produces signals 253 to 255 from output signals 240 to 246 of the latch 112.

The registers 115 and 116 respectively receive the signals 250–252 and the signals 253–255 during the H-level duration of the control signal EOC, and holds the received signals during the other period.

The function of the flash type A/D converter with the above-described structure will be described with reference to FIGS. 5A through 5K.

The converting operation of the A/D converter in FIG. 1 is executed in three stages of period 1, period 2 and period 3 shown in FIG. 5A.

The comparators 103–109 respectively compare the potentials of the signals supplied from the selector 102 with the potentials of the signal supplied from the sample and hold circuit 110, and outputs the comparison results as shown in FIG. 5F.

When the outputs of the comparators 103–109 become stable, the timing signal CLK becomes an H level as shown in FIG. 5A. As the timing signal S1 is at an H level as shown in FIG. 5C, the latch 111 latches the output signals of the comparators 103–109 and outputs the signals 230–236 as shown in FIG. 5G.

Upon reception of the signals 230–236, the encoder 113 encodes those signals and outputs the signals 200–207 and the signals 250–252 (see FIG. 5H). The signals 250–252 are upper three bits of the conversion result, the signal 250 indicating the most significant bit (MSB).

As mentioned earlier, the potentials of the signals 210–216 have the relationship of signal 210>signal 211>signal 212>signal 213>signal 214>signal 215>signal 216. In the period 2, therefore, the outputs of the comparators 103–109, the signals 200–207, and the signals 250–252 have signal levels as given in Table 2.

TABLE 2

Function of Encoder 113

| Outputs of Comparators | | | | | | | Signals | | | | | | | | Signals | | |
|---|---|---|---|---|---|---|---|---|---|---|---|---|---|---|---|---|---|
| 103 | 104 | 105 | 106 | 107 | 108 | 109 | 200 | 201 | 202 | 203 | 204 | 205 | 206 | 207 | 250 | 251 | 252 |
| 1 | 1 | 1 | 1 | 1 | 1 | 1 | 1 | 0 | 0 | 0 | 0 | 0 | 0 | 0 | 1 | 1 | 1 |
| 0 | 1 | 1 | 1 | 1 | 1 | 1 | 0 | 1 | 0 | 0 | 0 | 0 | 0 | 0 | 1 | 1 | 0 |
| 0 | 0 | 1 | 1 | 1 | 1 | 1 | 0 | 0 | 1 | 0 | 0 | 0 | 0 | 0 | 1 | 0 | 1 |
| 0 | 0 | 0 | 1 | 1 | 1 | 1 | 0 | 0 | 0 | 1 | 0 | 0 | 0 | 0 | 1 | 0 | 0 |
| 0 | 0 | 0 | 0 | 1 | 1 | 1 | 0 | 0 | 0 | 0 | 1 | 0 | 0 | 0 | 0 | 1 | 1 |
| 0 | 0 | 0 | 0 | 0 | 1 | 1 | 0 | 0 | 0 | 0 | 0 | 1 | 0 | 0 | 1 | 1 | 0 |
| 0 | 0 | 0 | 0 | 0 | 0 | 1 | 0 | 0 | 0 | 0 | 0 | 0 | 1 | 0 | 0 | 1 | 1 |
| 0 | 0 | 0 | 0 | 0 | 0 | 0 | 0 | 0 | 0 | 0 | 0 | 0 | 0 | 1 | 0 | 0 | 0 |

L level = 0
H level = 1

The operation for each period will be described below.

Operation (S0=H, S1=L and S2=L) in Period 1

The period 1 is a sampling period where an analog input signal is sampled. During this period, the timing signal S0 keeps an H level and the timing signals CLK, S1, S2 and EOC keeps an L level as shown in FIGS. 5A–5E.

As the timing signal S2 has an L level, the selector 102 selects the signals 210–216 from among the output signals of the D/A converter 101 and supplies the selected signals to the comparators 103–109. As the timing signal S0 has an H level, the sample and hold circuit 110 samples the voltage of the analog signal supplied to the analog input terminal AIN.

During this period, the output signals of the comparators 103–109, the signals 230–236, the signals 240–246, the signals 250–256 and the outputs of the registers 115 and 116 respectively keep the same potentials as those of the signals in the previous conversion cycle.

Operation (S0=L, S1=H and S2=L) in Period 2

During the period 2, upper three bits of the 6-bit data corresponding to the analog input signal are obtained.

The timing signal S0 becomes an L level as shown in 5B, so that the sample and hold circuit 110 supplies the potential of the analog input signal sampled in the period 1 to the non-inverting input terminals of the comparators 103–109. As the timing signal S2 keeps the L level as shown in FIG. 5D, the selector 102 selects the signals 210–216 as in the period 1.

Operation (S0=H, S1=L and S2=H) in Period 3

During the period 3, lower three bits of the 6-bit data corresponding to the analog input signal are obtained.

In the period 3, the timing signal S2 becomes an H level as shown in FIG. 5D, and the selector 102 selects the signals 220–226. At this time, the signals have the signal levels as given in Table 1.

The comparators 103–109 respectively compare signal levels of the signals 220–226 with the signal level of the output of the sample and hold circuit 110, and outputs the comparison results as shown in FIG. 5F.

When the outputs of the comparators 103–109 become stable, the timing signal CLK becomes an H level as shown in FIG. 5A. As the timing signal S2 is at an H level, the latch 111 latches the comparison results and outputs the signals 240–246 as shown in FIG. 5I.

The encoder 501 encodes the signals 240–246, and produces the signals 253–255 as shown in FIG. 5J. The signals 253–255 are lower three bits of the conversion result, the signal 255 indicating the least significant bit (LSB).

When the operation up to this point is complete, the timing signal EOC becomes an H level as shown in FIG. 5E, and at this timing, the register 115 latches the upper three bits of the conversion result while the register 116 latches the lower three bits of the conversion result as shown in FIG. 5K. Through the above operation, one converting operation is completed.

As mentioned earlier, the potentials of the signals 220–226 have the relationship of signal 220>signal 221>signal 222>signal 223>signal 224>signal 225>signal 226. Table 3 shows possible combinations of the outputs of the comparators 103–109, and the relationship between the signals 253–255 association with the combinations.

TABLE 3

Function of Encoder 501

| Outputs of Comparators | | | | | | | Signals | | |
|---|---|---|---|---|---|---|---|---|---|
| 103 | 104 | 105 | 106 | 107 | 108 | 109 | 253 | 254 | 255 |
| 1 | 1 | 1 | 1 | 1 | 1 | 1 | 1 | 0 | 0 |
| 0 | 1 | 1 | 1 | 1 | 1 | 1 | 0 | 1 | 0 |
| 0 | 0 | 1 | 1 | 1 | 1 | 1 | 0 | 0 | 1 |
| 0 | 0 | 0 | 1 | 1 | 1 | 1 | 0 | 0 | 0 |
| 0 | 0 | 0 | 0 | 1 | 1 | 1 | 0 | 0 | 0 |
| 0 | 0 | 0 | 0 | 0 | 1 | 1 | 0 | 0 | 0 |
| 0 | 0 | 0 | 0 | 0 | 0 | 1 | 0 | 0 | 0 |
| 0 | 0 | 0 | 0 | 0 | 0 | 0 | 0 | 0 | 0 |

L level = 0
H level = 1

TABLE 4

Function of Encoder 501

| Outputs of Comparators | | | | | | | Signals | | |
|---|---|---|---|---|---|---|---|---|---|
| 103 | 104 | 105 | 106 | 107 | 108 | 109 | 253 | 254 | 255 |
| 0 | 0 | 0 | 1 | 0 | 1 | 1 | 1 | 1 | 0 |
| 0 | 1 | 0 | 1 | 1 | 0 | 1 | 1 | 1 | 1 |
| 0 | 0 | 0 | 1 | 1 | 0 | 1 | 1 | 0 | 1 |

L level = 0
H level = 1

The shortcoming of the A/D converter shown in FIG. 1 will now be discussed.

When the difference between the potentials of the two input signals to each of the comparators 103–109 is sufficient large with respect to noise in the A/D converter, the comparators 103–109 can stably perform comparison without being affected by the noise. When the level of the internal noise of the A/D converter is equal to or greater than the difference between the potentials of the two input signals to each of the comparators 103–109, the comparators 103–109 may output erroneous comparison results due to the noise.

Table 4 shows three examples of the relationship between the output signals of the comparators 103–109 and the output signals 253–255 of the encoder 501 when the comparators 103–109 output erroneous signals due to noise. It is apparent from Table 4 that when the output signals of the comparators 103–109 are in error due to noise, the conversion results (253–255) have the wrong values.

To overcome this shortcoming, it is necessary to reduce noise in the A/D converter. With the use of a converter with high resolution precision, it is difficult to sufficiently reduce noise with respect to the resolution level.

Because of the above problem, a semi-flash type A/D converter, which can theoretically perform high-speed conversion at high precision, is actually susceptible to noise and has a difficulty in accomplishing high-precision conversion.

SUMMARY OF THE INVENTION

It is therefore a primary object of the present invention to provide a semi-flash type A/D converter capable of accurately converting an analog signal into a digital signal.

It is another object of this invention to provide a semi-flash type A/D converter which is susceptible to noise.

To achieve the objects, according to one aspect of this invention, there is provided a semi-flash type analog/digital converter comprising digital/analog conversion means for outputting a plurality of analog signals having voltages corresponding to output data of the analog/digital converter; a plurality of comparators for each comparing a voltage of an associated one of the analog signals output from the digital/analog conversion means with a voltage of an analog signal to be converted into digital data; encoding means for encoding output signals of the plurality of comparators to generate the output data of the analog/digital converter, the encoding means including correction encoding means for correcting the output signals of the plurality of comparators when the output signals are in error, and encoding the corrected signal; and analog signal input means for receiving the analog signal to be converted into the digital data and supplying the analog signal to the plurality of comparators.

According to another aspect of this invention, there is provided a semi-flash type analog/digital converter comprising digital/analog conversion means for outputting a predetermined first group of analog signals for producing predetermined upper bits of an analog/digital conversion result, and a second group of analog signals which are to produce predetermined lower bits of the analog/digital conversion result and are associated to the predetermined upper bits; a selector for selecting one of the first group of analog signals and the second group of analog signals, and supplying the selected group of analog signals; a plurality of comparators for each comparing a voltage of an associated one of the output signals of the selector with a voltage of an analog signal to be converted into digital data; first encoding means for encoding output signals of the plurality of comparators which are associated with the first group of analog signals to acquire the predetermined upper bits of the analog/digital conversion result, and supplying signals corresponding to the predetermined upper bits to the digital/analog conversion means; and second encoding means for encoding output signals of the plurality of comparators which are associated with the second group of analog signals to acquire the predetermined lower bits of the analog/digital conversion result, the second encoder having means for correcting any of the output signals of the plurality of comparators when that output signal is in error, and encoding the corrected signal.

According to a further aspect of this invention, there is provided a semi-flash type A/D converting method comprising a step of sampling an analog signal to be converted into a digital signal; a step of producing a first group of analog signals having predetermined mutually different voltages; a first comparison step of comparing each of the first group of analog signals with the analog signal sampled in the sampling step and outputting signals corresponding comparison results; a first encoding step of encoding signals output in the first comparison step; a step of producing a second group of analog signals having mutually different voltages in association with digital data acquired in the first encoding step; a second comparison step of comparing each of the second group of analog signals with the analog signal sampled in the sampling step and outputting signals corresponding comparison results; a second encoding step of encoding signals output in the second comparison step, the second encoding step including a step of correcting any of the output signals of the second comparison step when that output signal is in error, and encoding the corrected signal; and a step of linking digital signals acquired in the second encoding step to acquire a conversion result.

With the above structures, when the output signal of the converter or converting step have an abnormal value (the value that cannot actually occur), the encoding means or the second encoding step corrects this output signal to have a value that is estimated as correct, and encodes the corrected signal. Even when the output signal of the converter or the converting step is in error due to noise, therefore, this converter and the converting method can convert the analog input signal into a digital signal more accurately than the prior art.

DETAILED DESCRIPTION OF THE PREFERRED EMBODIMENT

A preferred embodiment of the present invention will now be described referring to the accompanying drawings.

Figure 1:
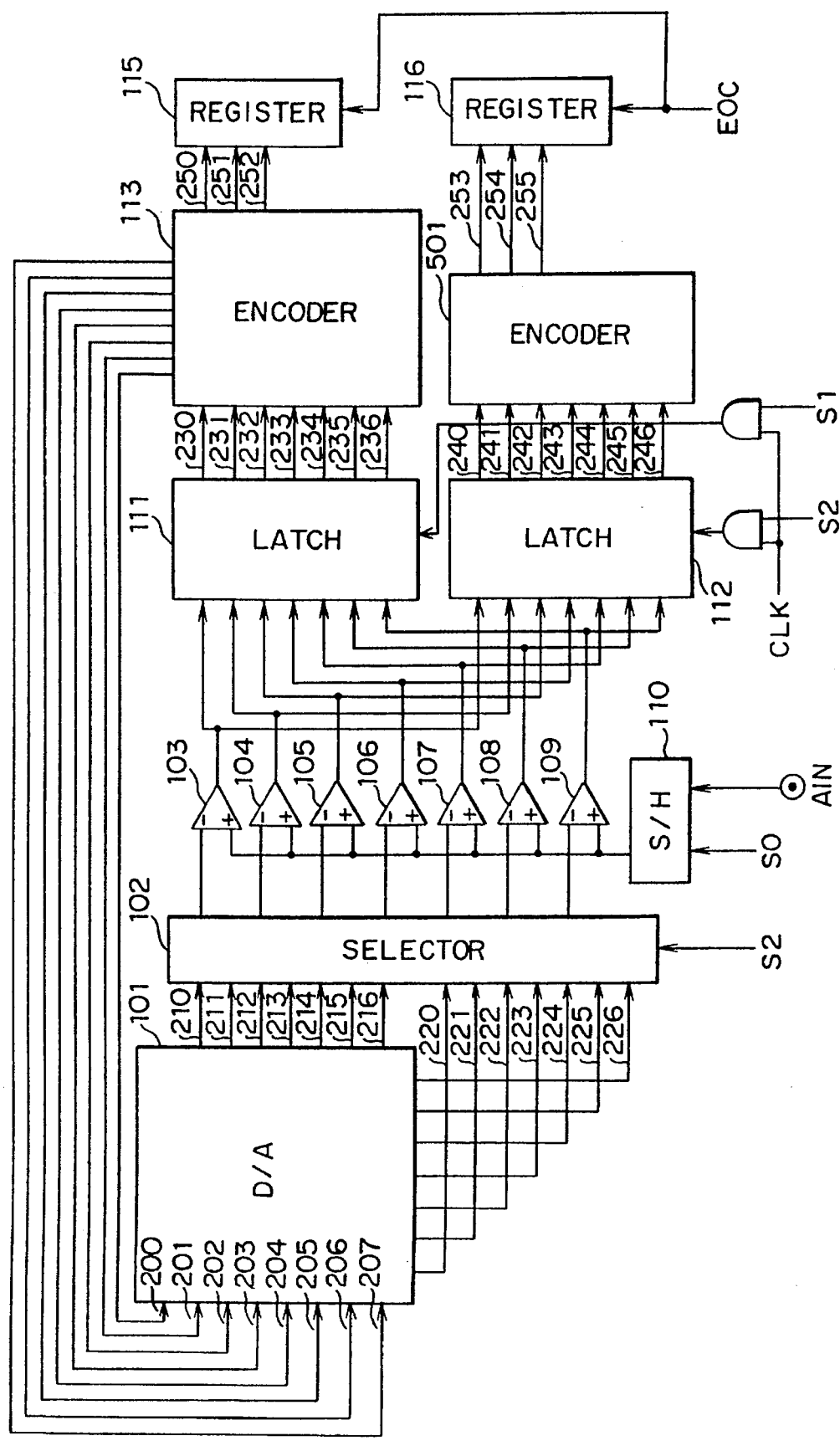
FIG. 1 is a block diagram exemplifying the structure of a conventional semi-flash type A/D converter.
Figure 6:
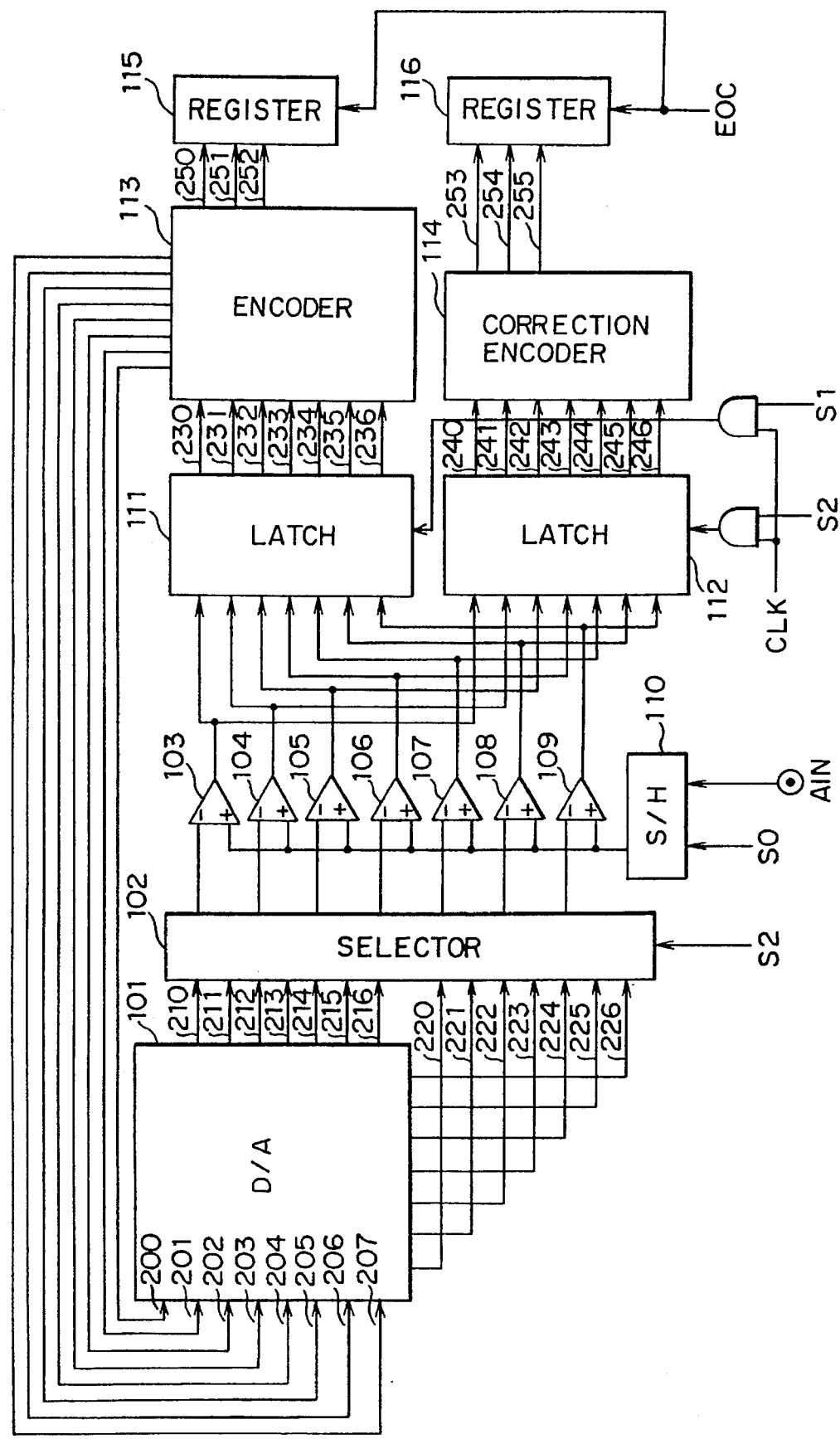
FIG. 6 is a block diagram illustrating the structure of a semi-flash type A/D converter according to one embodiment of this invention.

FIG. 6 illustrates the structure of a semi-flash type 6-bit A/D converter according to one embodiment of the present invention. This A/D converter performs two consecutive comparing operations by three bits to convert an analog input signal into 6-bit digital data. FIG. 6 uses the same reference numerals or symbols as used in FIG. 1 to denote corresponding or identical portions.

As shown in FIG. 6, the A/D converter of this embodiment comprises a D/A converter 101, a selector 102, seven comparators 103 to 109, a sample and hold circuit 110, latches 111 and 112, an encoder 113, a correction encoder 114, and registers 115 and 116 for storage of the conversion results. Signals S0, S1, S2, CLK and EOC are timing signals for controlling the converting operation, and are generated inside this semi-flash type A/D converter.

Figure 2:
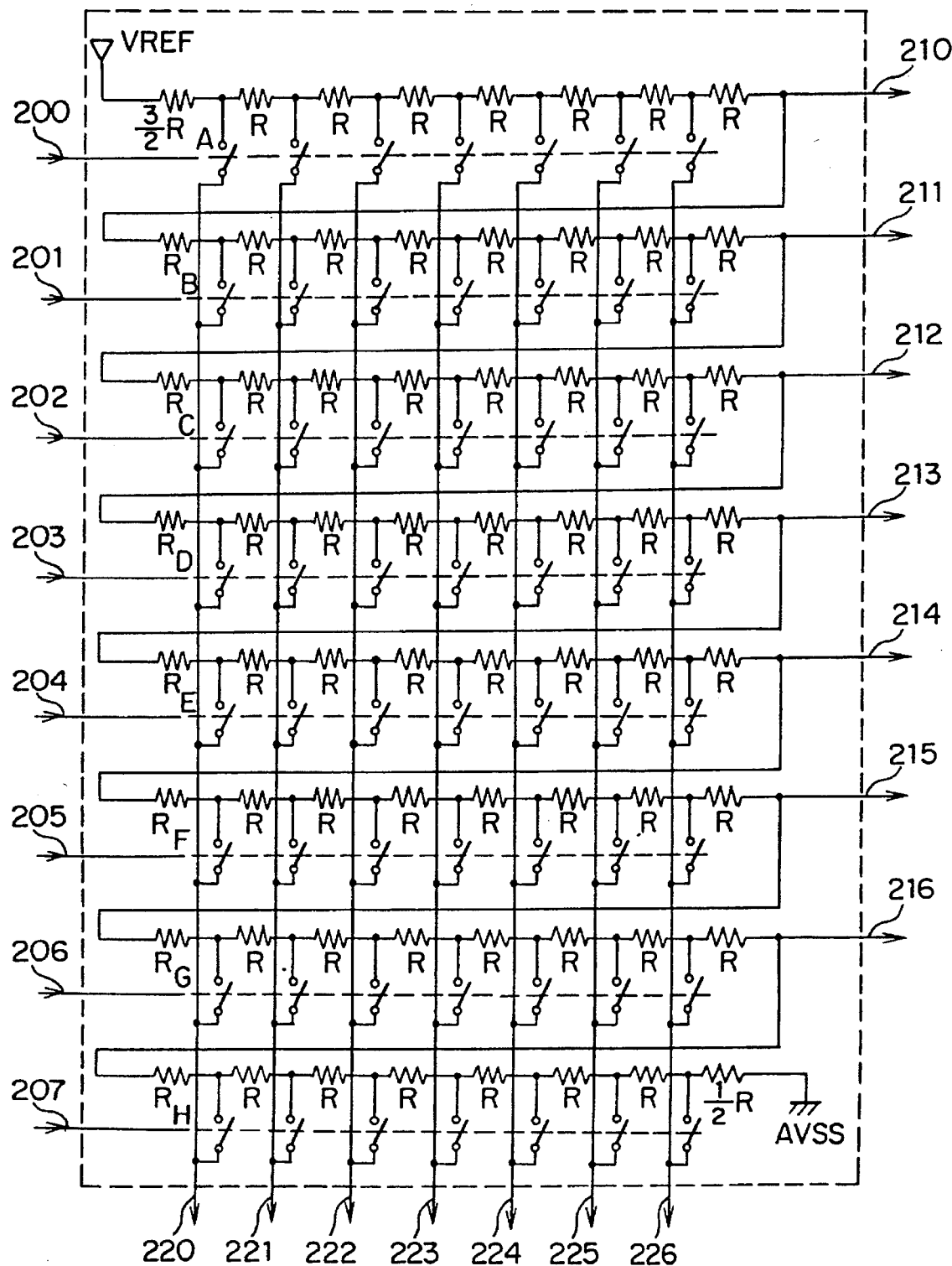
FIG. 2 is a circuit diagram showing an example of the structure of a D/A converter shown in FIG. 1.

The D/A converter 101 have a structure as shown in, for example, FIG. 2, and outputs signals 210 to 216 and signals 220 to 226.

The selector 102 selects the signals 210–216 during the L-level duration of the timing signal S2. During the H-level duration of the timing signal S2, the selector 102 selects the signals 220–226 and supplies the selected signals to inverting input terminals of the comparators 103–109.

Supplied to an analog input terminal AIN is an analog signal, which is to be converted into a digital signal. The sample and hold circuit 110 samples the potential of the analog signal supplied to the analog input terminal AIN during the H-level duration of the timing signal S0, and holds the sampled potential and supplies the sampled potential to the non-inverting input terminals of the comparators 103–109 during the L-level duration of the timing signal S0.

The comparators 103–109 each compare the potentials of the two input signals with each other. Each of the comparators 103–109 outputs an L-level signal when the potential of the signal supplied to the inverting input terminal is higher than that of the signal supplied to the non-inverting input terminal and outputs an H-level signal when the potential of the signal supplied to the inverting input terminal is lower than that of the signal supplied to the non-inverting input terminal.

The latch 111 latches the output signals of the comparators 103–109 while the timing signals S1 and CLK are both at an H level, and outputs the latched signals as signals 230 to 236 during the other period.

The latch 112 latches the output signals of the comparators 103–109 while the timing signals S2 and CLK are both at an H level, and outputs the latched signals as signals 240 to 246 during the other period.

Figure 3:
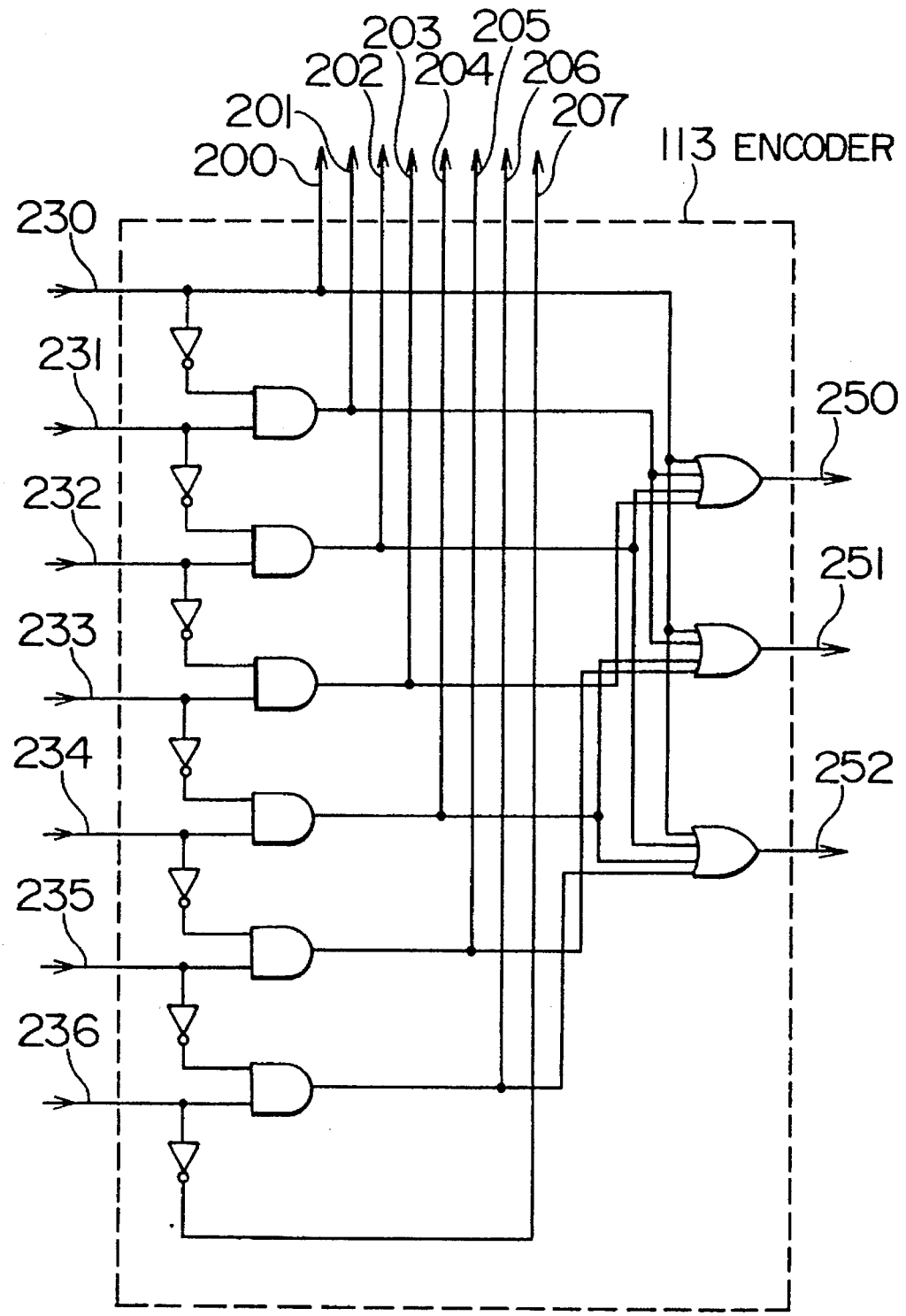
FIG. 3 is a block diagram showing an example of the structure of an encoder 113 shown in FIG. 1.
Figure 4:
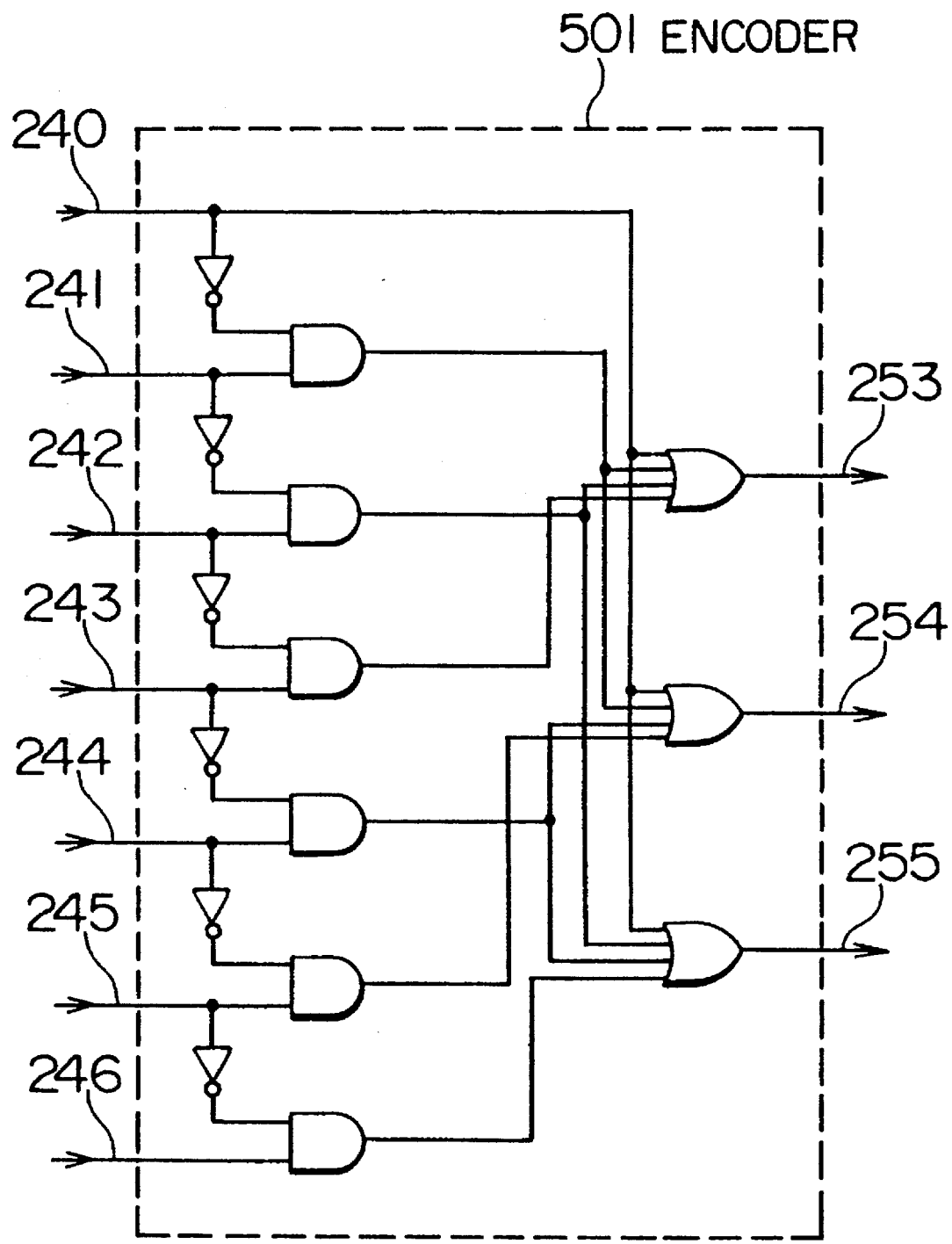
FIG. 4 is a block diagram showing an example of the structure of an encoder 501 shown in FIG. 1.

The encoder 113, which is a logic circuit having a structure as shown in, for example, FIG. 3, produces signals 250 to 252 as well as the signals 200 to 207 from output signals 230 to 236 of the latch 111.

The correction encoder 114 is a conventional encoder additionally provided with a priority control function. When the comparators 103–109 output abnormal signals, the correction encoder 114 do not encode them directly, but correct them to proper signals before encoding them, and outputs the encoded results as signals 253 to 255.

For instance, it seems that the correct value of the outputs of the comparators, "0001011", shown in Table 4 is "0001111" or "0000111". Accordingly, the correction encoder 114 corrects the input data "0001011" to "0001111" and then encodes the corrected data.

The registers 115 and 116 respectively receive the signals 250–252 and the signals 253–255 during the H-level duration of the control signal EOC, and holds the received signals during the other period.

The function of the flash type A/D converter with the above-described structure will be described below.

Figure 5:
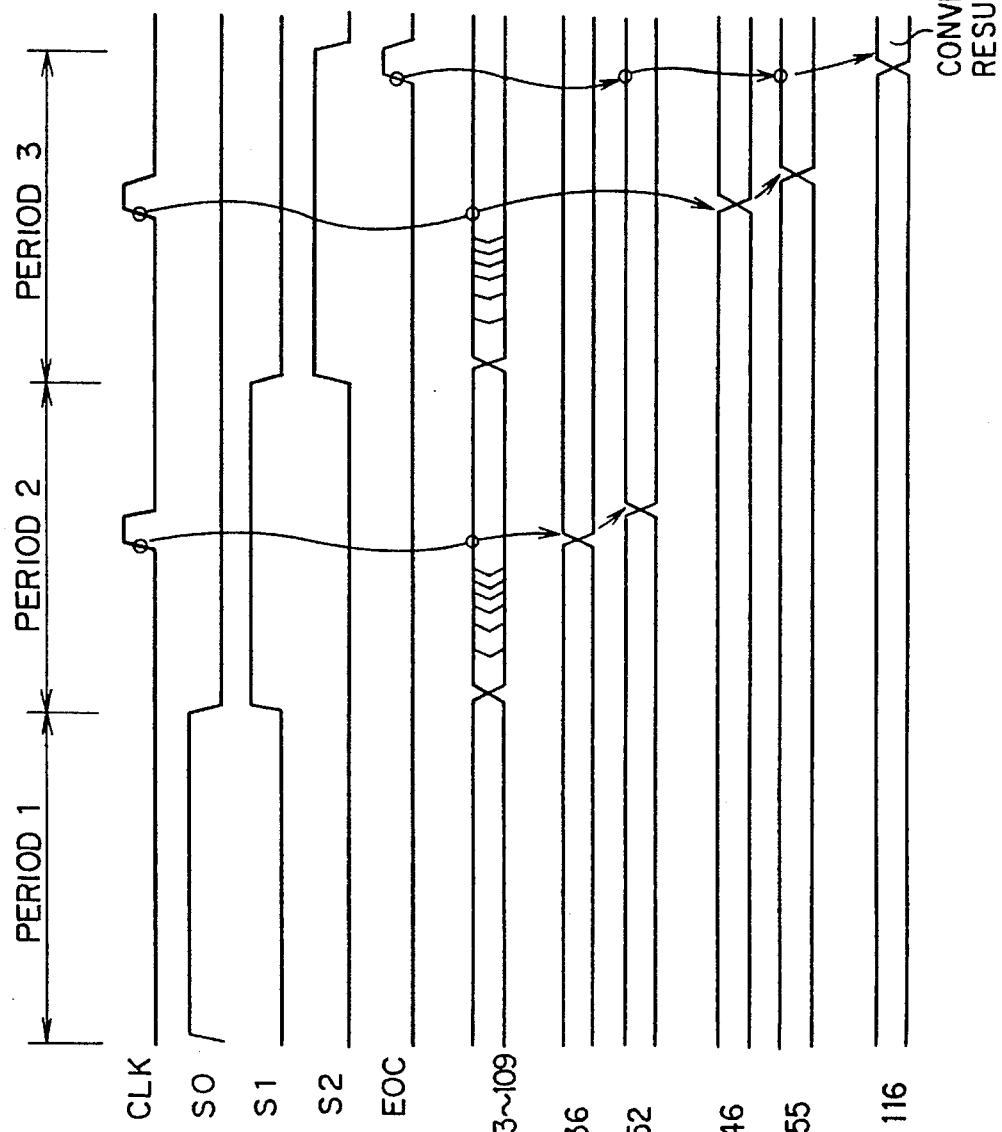
FIGS. 5A through 5K are timing charts for explaining the function of the conventional semi-flash type A/D converter and a semi-flash type A/D converter according to one embodiment of this invention.

The converting operation of the A/D converter in FIG. 6 is executed in three stages of period 1, period 2 and period 3 shown in FIG. 5A, as in the prior art.

Period 1:

As shown in FIGS. 5A through 5E, the timing signal S0 keeps a high level while the timing signals CLK, S1, S2 and EOC keep a low level. Consequently, the sample and hold circuit 110 samples the analog input signal.

Period 2:

The timing signal S0 becomes an L level as shown in 5B, so that the sample and hold circuit 110 supplies the potential of the analog signal sampled in the period 1 to the non-inverting input terminals of the comparators 103–109. As the timing signal S2 has an L level as shown in FIG. 5D, the selector 102 selects the signals 210–216. The comparators 103–109 respectively compare the potentials of the signals 210–216 supplied from the selector 102 with the potential of the signal supplied from the sample and hold circuit 110, and outputs the comparison results as shown in FIG. 5F. When the outputs of the comparators 103–109 become stable, the timing signal CLK becomes an H level as shown in FIG. 5A. As a result, the latch 111 latches the output signals of the comparators 103–109 and outputs the latched signals as the signals 230–236 as shown in FIG. 5G. Upon reception of the signals 230–236, the encoder 113 encodes those signals and outputs the signals 200–207 and the signals 250–252 shown in FIG. 5H.

Period 3:

The timing signal S2 becomes an H level as shown in FIG. 5D, and the selector 102 selects the signals 220–226. The comparators 103–109 respectively compare the signals 220–226 with the potential of the output of the sample and hold circuit 110, and outputs the comparison results as shown in FIG. 5F. When the outputs of the comparators 103–109 become stable, the timing signal CLK becomes an H level as shown in FIG. 5A. As a result, the latch 111 latches the comparison results and outputs the signals 240–246 as shown in FIG. 5I.

The encoder 114 encodes the signals 240–246, and produces the signals 253–255 as shown in FIG. 5J. The signals 253–255 are lower three bits of the conversion result, the signal 255 indicating the least significant bit (LSB).

When the comparators 103–109 output data (error data) as given in Table 4 due to noise, the correction encoder 114 correct the data and encodes the corrected data.

When the operation up to this point is complete, the timing signal EOC becomes an H level as shown in FIG. 5E, and at this timing, the register 115 latches the upper three bits of the conversion result while the register 116 latches the lower three bits of the conversion result as shown in FIG. 5K. Through the above operation, one converting operation is complete.

According to this embodiment, when the comparators 103–109 output abnormal data due to noise or the like, the correction encoder 114 corrects the data and converts the corrected data into code data. Accordingly, the acquired digital data accurately corresponds to the analog input signal. In other words, the present invention provides a semi-flash type A/D converter which is insusceptible to noise.

A description will now be given of an example of the structure of the correction encoder 114 referring to FIG. 7.

Figure 7:
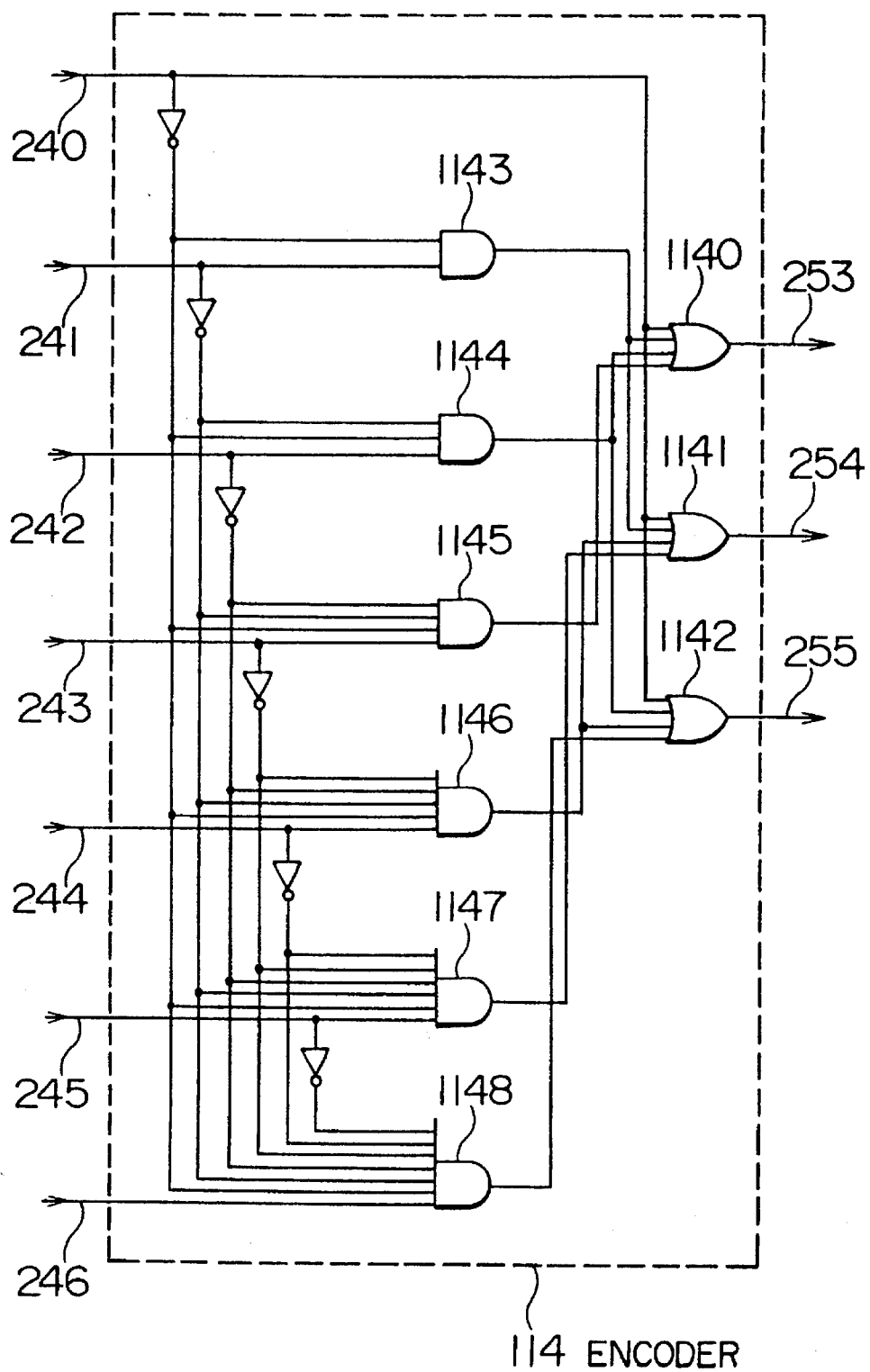
FIG. 7 is a block diagram showing an example of the structure of an encoder 114 shown in FIG. 6.

In FIG. 7, the signal 240 is supplied to AND gates 1143 to 1148 via an inverter. The signal 241 is supplied to the AND gate 1143 directly and to the AND gates 1144–1148 via an inverter. The signal 242 is supplied to the AND gate 1144 directly and to the AND gates 1145–1148 via an inverter. The signal 243 is supplied to the AND gate 1145 directly and to the AND gates 1146–1148 via an inverter.

The signal 244 is supplied to the AND gate 1146 directly and to the AND gates 1147 and 1148 via an inverter. The signal 245 is supplied to the AND gate 1147 directly and to the AND gate 1148 via an inverter. The signal 246 is directly supplied to the AND gate 1148.

An OR gate 1140 receives the signal 240 and the output signals of the AND gates 1143, 1144 and 1145, and outputs the signal 253. An OR gate 1141 receives the signal 240 and the output signals of the AND gates 1143, 1146 and 1147, and outputs the signal 254. An OR gate 1142 receives the signal 240 and the output signals of the AND gates 1144, 1146 and 1148, and outputs the signal 254.

The correction encoder 114 shown in FIG. 7 has the input/output characteristics given in Table 5. In Table 5, a region A indicates the output of this encoder 114 when the correct outputs are obtained from the comparators 103–109, and a region B indicates the output of this encoder 114 when the wrong outputs are obtained from the comparators 103–109.

TABLE 5

| | Function of Encorder 114 | | | | | | | | | |
|---|---|---|---|---|---|---|---|---|---|---|
| | Outputs of Comparators | | | | | | | Signals | | |
| | 103 | 104 | 105 | 106 | 107 | 108 | 109 | 253 | 254 | 255 |
| A | 1 | 1 | 1 | 1 | 1 | 1 | 1 | 1 | 1 | 1 |
| | 0 | 1 | 1 | 1 | 1 | 1 | 1 | 1 | 1 | 0 |
| | 0 | 0 | 1 | 1 | 1 | 1 | 1 | 1 | 0 | 1 |
| | 0 | 0 | 0 | 1 | 1 | 1 | 1 | 1 | 0 | 0 |
| | 0 | 0 | 0 | 0 | 1 | 1 | 1 | 0 | 1 | 1 |
| | 0 | 0 | 0 | 0 | 0 | 1 | 1 | 0 | 1 | 0 |
| | 0 | 0 | 0 | 0 | 0 | 0 | 1 | 0 | 0 | 1 |
| | 0 | 0 | 0 | 0 | 0 | 0 | 0 | 0 | 0 | 0 |
| B | 0 | 0 | 0 | 1 | 0 | 1 | 1 | 1 | 0 | 0 |
| | 0 | 1 | 0 | 1 | 1 | 0 | 1 | 1 | 1 | 0 |
| | 0 | 0 | 0 | 1 | 1 | 0 | 1 | 1 | 0 | 0 |

L level = 0
H level = 1

It is apparent from Table 5 that even when the outputs of the comparators 103–109 are abnormal, the encoder having the structure shown in FIG. 7 can output correctly encoded signals. Even with large noise, therefore, this A/D converter can output correct digital data.

Generally speaking, the encoder shown in FIG. 7 is a circuit which considers all of those bits whose digits are equal to or lower than that of the most significant bit having an H("1") level, as having H levels, when receiving abnormal data. Therefore, the output data "0001011" and "0001101" of the comparators 103–109 are treated as "0001111" and the output data "0101101" is treated as "0111111", as shown in Table 5.

Another example of the structure of the correction encoder 114 will be described below referring to FIG. 8.

Figure 8:
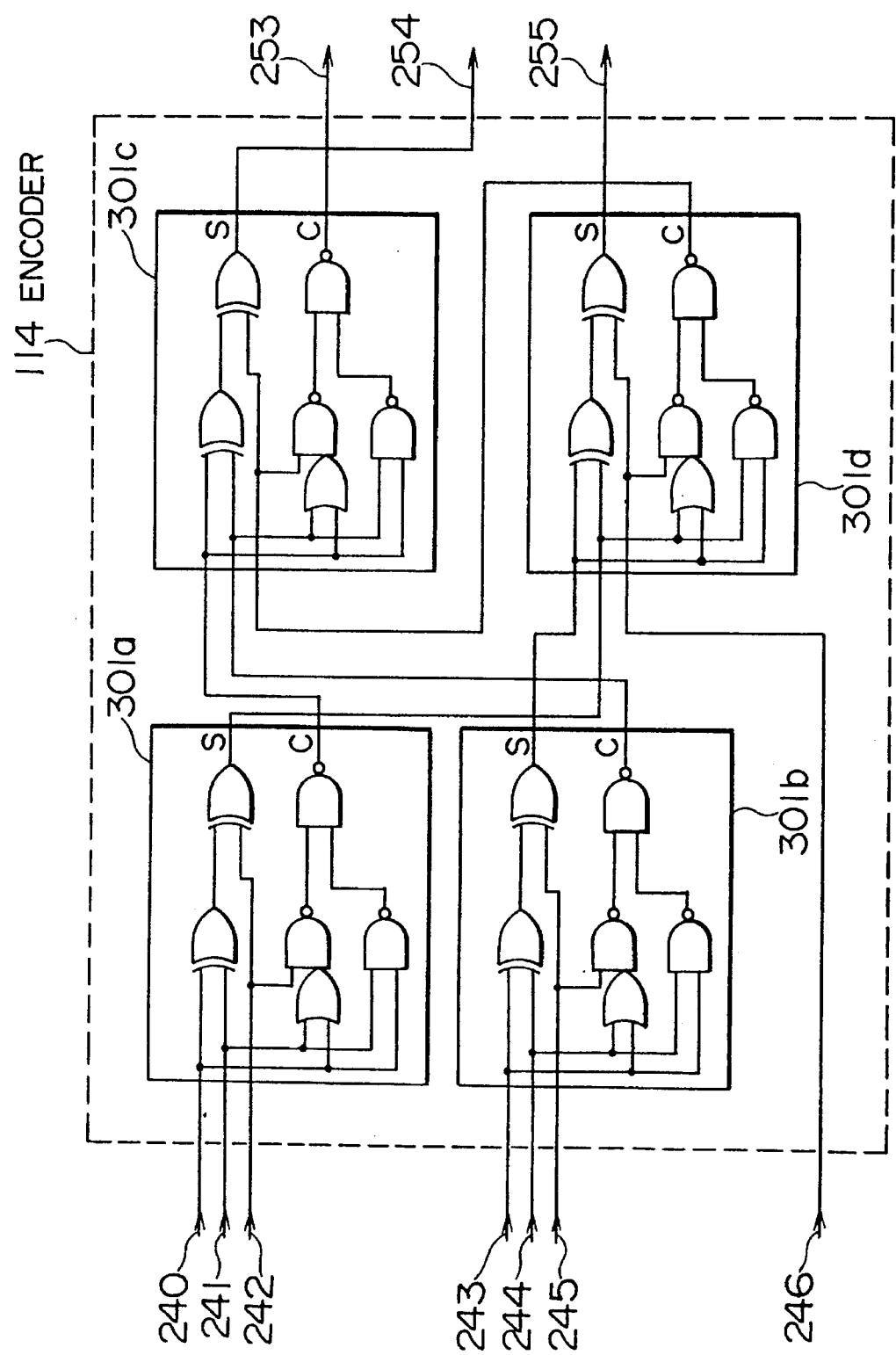
FIG. 8 is a block diagram showing another example of the structure of the encoder 114 shown in FIG. 6.

In FIG. 8 the encoder 114 comprises four full adders 301a to 301d.

The full adder 301a adds the signals 240, 241 and 242. The full adder 301b adds the signals 243, 244 and 245. The full adder 301c adds the carry outputs C of the full adders 301a, 301b and 301d. The full adder 301d adds the sum outputs S of the full adders 301a and 301b, and the signal 246. The carry output C of the full adder 301c becomes the signal 253, the sum output S of the full adder 301c becomes the signal 254, and the sum output S of the full adder 301d becomes the signal 255.

The correction encoder 114 shown in FIG. 8 has the input/output characteristics given in Table 6. In Table 6, a region A indicates the output of this encoder 114 when the correct outputs are obtained from the comparators 103–109, 109 and a region B indicates the output of this encoder 114 when the wrong outputs are obtained from the comparators 103–109.

It is apparent from Table 6 that even when the outputs of the comparators 103–109 are abnormal, the encoder having the structure shown in FIG. 8 do not encode the abnormal data directly, but convert the data to code data corresponding to the data that is estimated as correct. Even with large noise, therefore, this A/D converter can output correct digital data.

Generally speaking, the encoder shown in FIG. 8 is a circuit which considers the most significant bit of bit data having an H ("1") level as having an L level and treats all the bits lower than that bit as having an H level. Therefore, the output data "1011111" of the comparators 103–109 is treated as "0111111," the output data "0101111" is treated as "0011111," the output data "0001011" is treated as "0000111" and the output data "0110111" is treated as "0011111."

TABLE 6

Function of Encorder 301

| | Outputs of Comparators | | | | | | | Signals | | |
|---|---|---|---|---|---|---|---|---|---|---|
| | 103 | 104 | 105 | 106 | 107 | 108 | 109 | 253 | 254 | 255 |
| A | 1 | 1 | 1 | 1 | 1 | 1 | 1 | 1 | 1 | 1 |
|   | 0 | 1 | 1 | 1 | 1 | 1 | 1 | 1 | 1 | 0 |
|   | 0 | 0 | 1 | 1 | 1 | 1 | 1 | 1 | 0 | 1 |
|   | 0 | 0 | 0 | 1 | 1 | 1 | 1 | 1 | 0 | 0 |
|   | 0 | 0 | 0 | 0 | 1 | 1 | 1 | 0 | 1 | 1 |
|   | 0 | 0 | 0 | 0 | 0 | 1 | 1 | 0 | 1 | 0 |
|   | 0 | 0 | 0 | 0 | 0 | 0 | 1 | 0 | 0 | 1 |
|   | 0 | 0 | 0 | 0 | 0 | 0 | 0 | 0 | 0 | 0 |
| B | 1 | 0 | 1 | 1 | 1 | 1 | 1 | 1 | 1 | 0 |
|   | 0 | 1 | 0 | 1 | 1 | 1 | 1 | 1 | 0 | 1 |
|   | 0 | 0 | 0 | 0 | 0 | 1 | 0 | 0 | 0 | 1 |
|   | 0 | 0 | 0 | 1 | 0 | 1 | 1 | 0 | 1 | 1 |
|   | 0 | 1 | 1 | 0 | 1 | 1 | 1 | 1 | 0 | 1 |

L level = 0
H level = 1

In the field of digital signal processing, generally, averaging (which performs A/D conversion plural times and obtains the average of the resultant converted values) is employed to eliminate a white-noise oriented variation in the converted value at the time of A/D conversion. The use of the correction encoder shown in FIG. 8 can eliminate such a white-noise oriented variation in the converted value, and can improve the conversion precision of the A/D converter itself.

The present invention is not limited to the above-described embodiments. For instance, although digital data after A/D conversion has six bits in this embodiment, the digital data may have a different number of bits, e.g., 8 bits or 12 bits.

What is claimed is:

1. A semi-flash type analog/digital converter comprising:

digital/analog conversion means for outputting a plurality of analog signals having voltages corresponding to output data of said analog/digital converter;

a plurality of comparators, each for comparing a voltage of an associated one of said analog signals output from said digital/analog conversion means with a voltage of an analog signal to be converted into digital data;

encoding means, connected to said digital/analog conversion means and said comparators, for encoding output signals of said plurality of comparators to generate the output data of said analog/digital converter, said encoding means including correction encoding means for correcting said output signals of said plurality of comparators when said output signals are in error, and encoding said corrected signal, said correction encoding means comprising an adder circuit for adding input signals, which are based on said output signals of a predetermined number of said comparators, to provide a predetermined output signal; and analog signal input means for receiving said analog signal to be converted into said digital data and supplying said analog signal to said plurality of comparators.

2. The semi-flash type analog/digital converter according to claim 1, wherein said correction encoding means comprises means for judging that a most significant digit signal of those signals from said comparators which have a first logic level has a second logic level and signals at lower digits than said most significant digit signal have said first logic level, and encoding said signals.

3. A semi-flash type analog/digital converter, comprising:

digital/analog conversion means for outputting a predetermined first group of analog signals for producing predetermined upper bits of an analog/digital conversion result, and a second group of analog signals which are to produce predetermined lower bits of said analog/digital conversion result and are associated to said predetermined upper bits;

a selector for selecting one of said first group of analog signals and said second group of analog signals, and supplying said selected group of analog signals;.

a plurality of comparators for each comparing a voltage of an associated one of said output signals of said selector with a voltage of an analog signal to be converted into digital data;

first encoding means for encoding output signals of said plurality of comparators which are associated with said first group of analog signals to acquire said predetermined upper bits of said analog/digital conversion result, and supplying signals corresponding to said predetermined upper bits to said digital/analog conversion means; and second encoding means for encoding output signals of said plurality of comparators which are associated with said second group of analog signals to acquire said predetermined lower bits of said analog/digital conversion result, said second encoding means having means for correcting any of said output signals of said plurality of comparators when that output signal is in error, and encoding said corrected signal;

wherein said correction encoding means comprises an adder circuit for adding input signals to acquire a predetermined output signal.

4. The semi-flash type analog/digital converter according to claim 3, wherein said correction encoding means comprises means for judging that a most significant bit signal of those signals from said comparators which have a first logic level has a second logic level and that those signals at lower positions than said most significant bit signal have said first logic level, and encoding said signals.

5. A semi-flash type A/D converting method, comprising:

a step of sampling an analog signal to be converted into a digital signal;

a step of producing a first group of analog signals having predetermined mutually different voltages;

a first comparison step of comparing each of said first group of analog signals with said analog signal sampled in said sampling step and outputting signals corresponding to comparison results;

a first encoding step of encoding signals output in said first comparison step;

a step of producing a second group of analog signals having mutually different voltages in association with digital data acquired in said first encoding step;

a second comparison step of comparing each of said second group of analog signals with said analog signal sampled in said sampling step and outputting signals corresponding to comparison results;

a second encoding step of encoding signals output in said second comparison step, said second encoding step including a step of correcting any of said output signals of said second comparison step when that output signal is in error, and encoding said corrected signal; and a step of linking digital signals acquired in said first and second encoding steps to acquire a conversion result; wherein said second encoding step includes an adding step for adding outputs signals acquired in said comparison steps to acquire a predetermined output signal.

6. A semi-flash type A/D converting method, comprising:

a step of sampling an analog signal to be converted into a digital signal;

a step of producing a first group of analog signals having predetermined mutually different voltages;

a first comparison step of comparing each of said first group of analog signals with said analog signal sampled in said sampling step and outputting signals corresponding to comparison results;

a first encoding step of encoding signals output in said first comparison step;

a step of producing a second group of analog signals having mutually different voltages in association with digital data acquired in said first encoding step;

a second comparison step of comparing each of said second group of analog signals with said analog signal sampled in said sampling step and outputting signals corresponding to comparison results;

a second encoding step of encoding signals output in said second comparison step, said second encoding step including a step of correcting any of said output signals of said second comparison step when that output signal is in error, and encoding said corrected signal; and a step of linking digital signals acquired in said first and second encoding Steps to acquire a conversion result; wherein said second encoding step includes a step of judging that a most significant bit signal of those signals acquired in said second comparison step which have a first logic level has a second logic level and that signals at lower positions than said most significant bit signal have said first logic level, and encoding said signals.

* * * * *

UNITED STATES PATENT AND TRADEMARK OFFICE
CERTIFICATE OF CORRECTION

PATENT NO.   : 5,463,395
DATED        : October 31, 1995
INVENTOR(S)  : Yasunori SAWAI It is certified that error(s) appears in the above-identified patent and that said Letters Patent is hereby corrected as shown below:

Col. 4, TABLE 2, under column "250", line 6, delete "1", insert --0--.

Col. 4, TABLE 2, under column "251", line 7, delete "1", insert --0--.

Col. 5, TABLE 3, under column "108", line 7, delete "1", insert --0--.

Signed and Sealed this

Thirtieth Day of July, 1996

*Attest:*

BRUCE LEHMAN

*Attesting Officer*  *Commissioner of Patents and Trademarks*